United States Patent [19]

Murakami

[11] Patent Number: 4,683,519
[45] Date of Patent: Jul. 28, 1987

[54] CONNECTION STRUCTURE

[75] Inventor: Osamu Murakami, Yokohama, Japan

[73] Assignee: Canon Kabushiki Kaisha, Tokyo, Japan

[21] Appl. No.: 790,960

[22] Filed: Oct. 24, 1985

[30] Foreign Application Priority Data

Oct. 30, 1984 [JP] Japan ................................. 59-226748

[51] Int. Cl.⁴ .............................................. H05K 9/00
[52] U.S. Cl. ...................................... 361/424; 361/400
[58] Field of Search ............... 361/424, 400, 395, 399; 174/35 MS, 35 GC; 339/17 C, 14 R, 143 R

[56] References Cited

U.S. PATENT DOCUMENTS 4,230,777 10/1980 Gatto ..................................... 429/97
4,554,400 11/1985 Schmalzl .......................... 361/424 X
4,570,039 2/1986 Osawa et al. ........................ 200/5 A Primary Examiner—A. D. Pellinen
Assistant Examiner—Morris Ginsburg
Attorney, Agent, or Firm—Spencer & Frank

[57] ABSTRACT

Connection structure for connecting electrically and mechanically electronic components or devices, such as a printed circuit board, an LSI, an IC, a display device, a switch, a printer unit or a battery, by using a noise shield plate which is made from an electrically conductive resilient thin plate for shielding electrically the electronic components from external electrical noise and which is contained in the case. The connection structure greatly reduces the number of parts required for the structure and the number of assembly steps when assembling the structure, and thus the connection structure is provided at a lower cost.

13 Claims, 7 Drawing Figures

CONNECTION STRUCTURE

BACKGROUND OF THE INVENTION

1. Field of the Invention

The present invention relates to a connection structure for connecting electrically and mechanically electronic components or devices such as a printed circuit board, an LSI, an IC, a display device, a switch, a printer unit or a battery.

2. Description of the Prior Art.

In an electronic apparatus such as a calculator, a hand-held computer, a hand-held word-processor, a pocket radio, a tape recorder or a video camera containing electronic components such as the above-mentioned, electronic components or devices such as a printed circuit board or an LSI are mounted inside the apparatus, and these electronic components or devices are mutually connected electrically by a lead wire or printed wiring, and furthermore are connected mechanically by a mechanically connecting member such as a screw, a rubber pressing member or adhesive.

FIGS. 1A and 1B show a calculator as an example of such an apparatus. This calculator comprises an upper case 1 and a lower case 4, each case being formed into a flat rectangular body shape.

The upper case 1 and the lower case 4 are secured in one piece by screws or adhesive.

A facing plate 2, formed by a thin sheet of aluminum or similar material, on a surface of which a special design is worked by means of offset printing, etching or the like, is adhered to a surface of the upper case 1 by adhesive or similar agent.

A keyboard 3 having a plurality of keys is disposed on the surface of the upper case 1.

A flat package type LSI 5 is disposed on a printed circuit board (not shown) inside the case. A (+) side terminal 5a and a (−) side terminal 5b are disposed separately on a right and a left side of this LSI 5.

Reference numerals 6a and 6b denote batteries which are connected in series, for example, through an intermediate contact plate (not shown). A (+) electrode and a (−) electrode of the batteries 6a and 6b are connected to a power supply pattern on a printed circuit board through electrically conductive sheet springs 7 and 8, respectively.

Reference numeral 9 denotes a liquid crystal display device for displaying an input, a result of a calculation, or some other required information.

In calculators of the type just described, the known arrangement of electrical connections among the components or devices in the electronic apparatus having the structure described above suffers from the problems described below.

(1) A connection between the liquid crystal display device 9 and the printed circuit board is made by a conductive rubber connector in which conductive rubber and insulating rubber are stacked in layers at equivalent pitch or by a heat seal member. This connecting means, however, has the defects of being expensive and of involving a large number of steps during assembly.

(2) The (+) and (−) electrodes of the batteries 6a and 6b are connected to a predetermined pattern on the printed circuit board via the individual sheet springs 7 and 8, so that when the printed circuit board is a single-sided board and the (+) and (−) input terminals of the LSI 5 are positioned on opposite sides, i.e., on the right and left sides as shown in FIG. 1A, the (+) power supply terminal of the LSI 5 and the (+) battery terminal must be connected with a jumper wire. This causes an increase in cost.

(3) When two printed circuit boards are arranged in layers via an insulating sheet, the top and bottom printed circuit boards must be connected electrically at a plurality of positions. In conventional arrangements, rubber piece members are provided at predetermined connecting positions and the elastic force of the rubber produced when the cases 1 and 4 are pressed together presses the upper and lower printed circuit boards against each other, so that these printed circuit boards are connected electrically.

When an arrangement such as this structure is adopted, however, the elastic force of the rubber is large, so that when a number of rubber piece members are disposed at a number of pressing positions, the pressure of the rubber opens out the upper case 1 and the lower case 4. Consequently, a large number of screws for securing the upper and lower cases must be used, and as a result, the number of parts and the number of assembly steps increase, which cause an increase in costs.

SUMMARY OF THE INVENTION

It is, therefore, an object of the present invention to provide a connection structure that eliminates the above-mentioned disadvantages in a conventional arrangement, and which can connect electrically and mechanically various electronic components or devices inside an electronic apparatus with extremely good efficiency, and can reduce the number of parts and the number of assembly steps to achieve significant reduction in costs.

It is another object of the present invention to provide a connection structure which is preferable to manufacture a thin electronic apparatus in which thin electronic components or devices are connected electrically and mechanically.

In the first aspect of the present invention, a connection structure for connecting electrically and mechanically electronic components contained in a case having an upper case and a lower case to each other, comprises:

a noise shield plate made from electrically conductive resilient thin plate for shielding electrically the electronic components from external electrical noise, the noise shield plate being contained in the case; and a resilient protrusion formed integrally with the noise shield plate at a position relating to a position of the electronic components for pressing one of the electronic components against the upper or lower case through another electronic component to connect electrically the electronic components to each other.

Here, the one electronic component may be a first flexible printed circuit board. Another electronic component can be a battery, a liquid crystal display device or a second flexible printed circuit board. The noise shield plate may be disposed adjacent to the second flexible printed circuit board.

Here, an electrically insulating plate may be inserted between the first flexible printed circuit board and the second flexible printed circuit board, and an opening may be formed in the electrically insulating plate at a position corresponding to the resilient protrusion, so that both the first and second flexible printed circuit boards are contacted with each other through the opening by the protrusion contacts.

A flexible tongue member may be disposed in one of the first and second flexible printed circuit boards which is pressed directly by the protrusion. The flexible tongue member can be disposed at a position corresponding to a pressing position at which the one flexible printed circuit board is pressed directly by the protrusion. An electrically conductive pattern which is connected electrically to the other of the first and second flexible printed circuit boards may be disposed on the flexible tongue member. Here, a rib for receiving a force by the protrusion may be disposed at a position of the upper or lower case corresponding to the pressing position.

In the second aspect of the present invention, a connection structure to be connected electrically and mechanically to an electronic component contained in a case having an upper case and a lower case, comprises:

a noise shield plate made from electrically conductive resilient thin plate for shielding electrically the electronic component from external electrical noise, the noise shield plate being contained in the case; and a resilient protrusion formed integrally with the noise shield plate at a positioned relating to a position of the electronic component for pressing the electronic component against the upper or lower case to be connected electrically to the electronic component.

Here, the electronic component may be a first flexible printed circuit board or a battery. An electrically insulating plate and a second flexible printed circuit board can be disposed between the first flexible printed circuit board and the noise shield plate.

An opening may be formed in the electrically insulating plate and the second flexible printed circuit board at a position corresponding to the resilient protrusion, so that the resilient protrusion is contacted with the flexible printed circuit board through the opening by an elasticity of the resilient protrusion.

In the third aspect of the present invention, a connection structure for securing mechanically an electronic component contained in a case having an upper case and a lower case to the case, comprises:

an engaging member formed in the upper case or the lower case and being so shaped that the engaging member is engaged with the electronic component;

a noise shield plate made from electrically conductive resilient thin plate for shielding electrically the electronic component from external electrical noise, the noise shielding plate being contained in the case; and a flexible swollen member formed integrally with the noise shield plate at a position relating to a position of the electronic component for pressing the electronic component against the upper case or the lower case so as to mount the electronic component on the engaging member.

The above and other objects, effects, features and advantages of the present invention will becomes more apparent from the following description of preferred embodiments thereof taken in conjunction with the accompanying drawings.

DETAILED DESCRIPTION OF PREFERRED EMBODIMENTS

Figure 1:
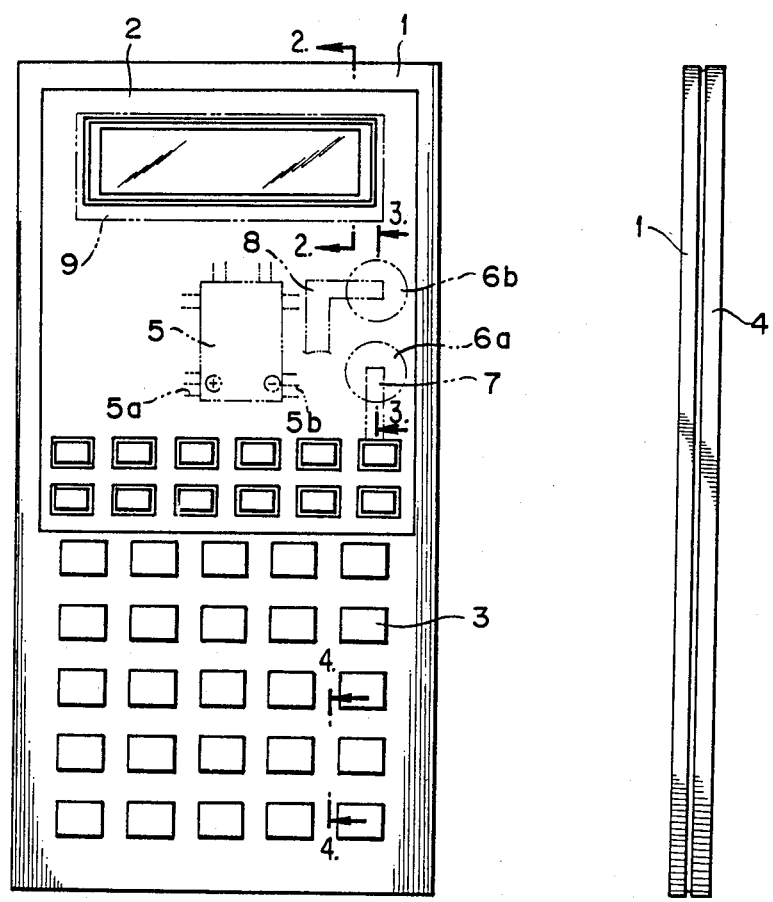
FIG. 1A is a plane view showing an example of a calculator having a conventional component arrangement.
FIG. 1B is a side view of the calculator.

FIGS. 2-6 show various embodiments of the present invention. The same reference numerals are used in these drawings as in FIGS. 1A and 1B for the same or corresponding parts, and no explanation will be given for those parts.

Figure 2:
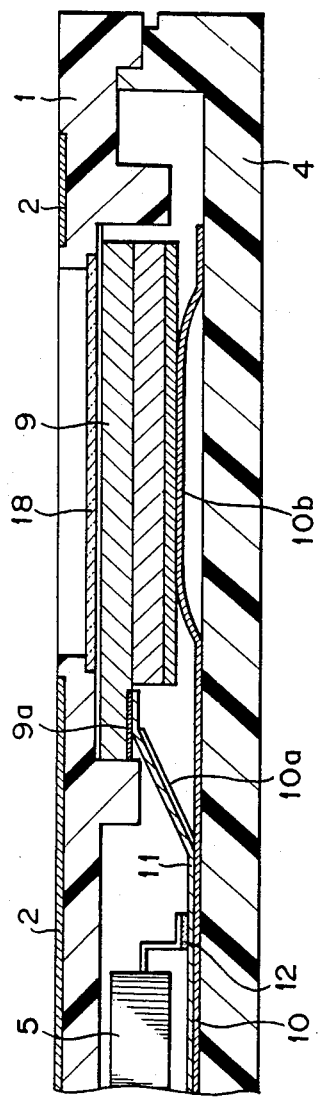
FIG. 2 is a cross-sectional view taken along the line 2—2 in FIG. 1, and showing an embodiment of a connection structure according to the present invention.
Figure 6:
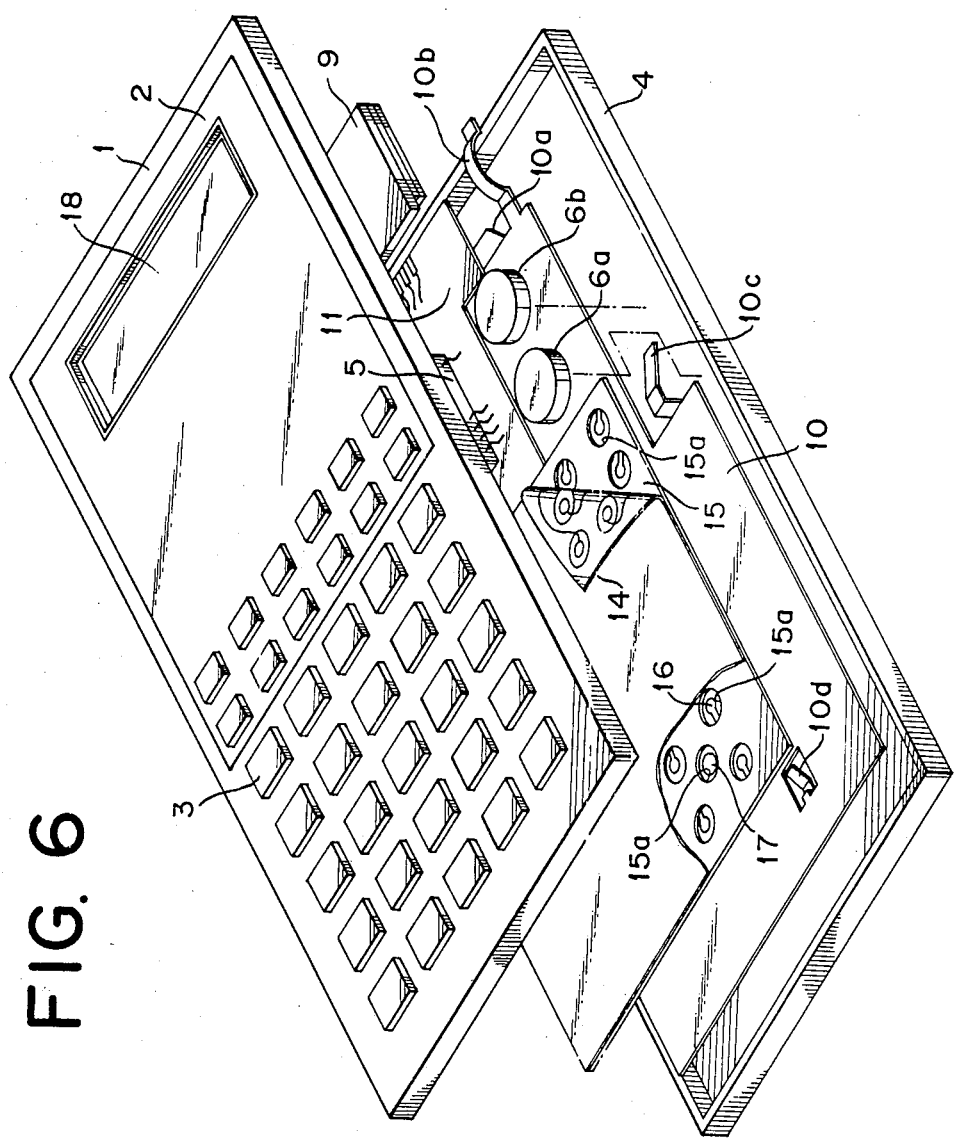
FIG. 6 is a perspective view showing an embodiment of a calculator incorporating several connection structures in accordance with the present invention.

FIG. 2 shows an embodiment of a connection structure between a liquid crystal display device 9 and a printed circuit board in a portion corresponding to a cross-section taken along a line 2—2 in FIG. 1A. Reference numeral 10 in FIG. 2 denotes an electrically conductive flexible thin plate (hereinafter referred to as noiseshield plate) for shielding electrically noise from an external noise. As can be seen in FIG. 6, this plate 10 is secured to substantially the whole area of an inside surface of the lower case 4.

As can also be seen in FIG. 6, a flexible printed circuit board 11 is laid over the upper side of this noise shield plate 10.

This printed circuit board 11 can be made, for example, by sticking aluminum foil onto a polyester sheet. A desired printed circuit is formed on this printed circuit board 11 by printing a circuit pattern using carbon ink as resist, and then removing the portions other than that circuit pattern by etching process.

The LSI 5 is secured to the top of this flexible printed circuit board 11 by electrically conductive adhesive 12.

Reference numeral 10a denotes an inclined protrusion cut out of and pushed up from a portion of the noise shield plate 10 in the vicinity of an electrode 9a of the liquid crystal display device 9 in a manner that the protrusion 10a is inclined upward. This protrusion 10a pushes up a portion of the flexible printed circuit board 11 which is to be connected to the liquid crystal display device 9, and further pushes directly against the electrode 9a of the liquid crystal display device 9 so as to form an electrical connection between the electrode 9a and the printed circuit board 11. Reference numeral 18 denotes a face plate for protecting a display portion of the liquid crystal display device 9.

In this embodiment, therefore, an electrically conductive rubber connector or a heat seal member such as in conventional arrangements are not necessary, thereby permitting a large reduction in the number of parts and the number of assembly steps.

Reference numeral 10b denotes a swollen portion which is a protrusion expanded outward in a portion of the noise shield plate 10 corresponding to the body of the liquid crystal display device 9. This swollen portion 10b pushes the liquid crystal display device 9 upward against the upper case 1 to secure the liquid crystal display device 9 to the case 1 mechanically.

The formation of this swollen portion 10b eliminates the need for elastic members such as a rubber member disposed between the lower case 4 and the liquid crystal display device 9 so as to push the liquid crystal display device 9 against the upper case 1 as in conventional arrangements. This reduces the number of parts and the number of assembly steps, and thus allows for reductions in costs.

Figure 3:
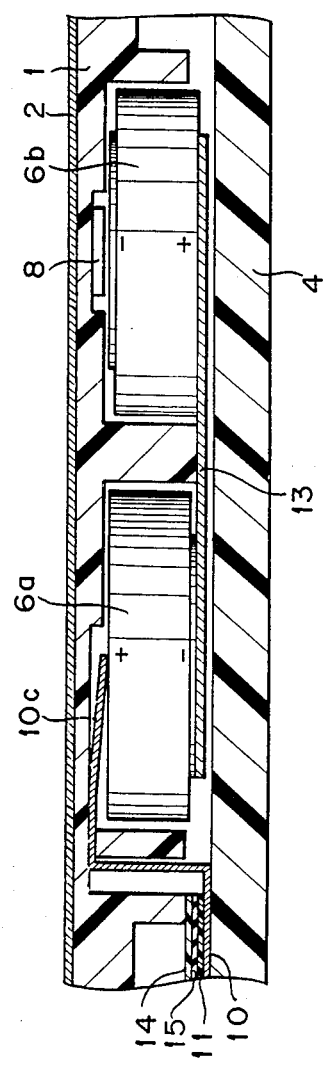
FIG. 3 is a cross-sectional view taken along the line 3—3 in FIG. 1, and showing a connection structure of another embodiment of the present invention.

FIG. 3 shows an embodiment of a connection structure in a battery loading portion corresponding to a cross-section taken along a line 3—3 in FIG. 1A.

In FIG. 3, a lower side of the battery 6a shows a (−) electrode, and a lower side of the battery 6b shows a (+) electrode. Both the electrodes are connected in series to each other by a contact plate 13.

The (−) electrode side of the battery 6b contacts resiliently a contact plate 8 made of leaf spring. In FIG. 3, this contact plate 8 is connected electrically to a predetermined position of a lower flexible printed circuit board (not shown), and is connected to the (−) electrode of the LSI 5 through a wiring pattern on the lower flexible printed circuit board.

Reference numeral 10c denotes a protrusion formed in the noise shield plate 10 at a position corresponding to the position of the battery 6a. This protrusion 10c serves as a (+) side battery contact, and contacts resiliently the (+) electrode of the battery 6a.

In conventional arrangements, instead of this contact 10c, a separate leaf spring was used in the similar manner to the (−) side battery contact 8. In the embodiment of the present invention, however, as shown in FIGS. 3 and 6, a portion of the noise shield plate 10 is extended and bent to form the (+) side battery contact 10c.

This arrangement reduces the number of parts and the number of assembly steps, and therefore the connection structure is provided at a lower cost.

Figure 4:
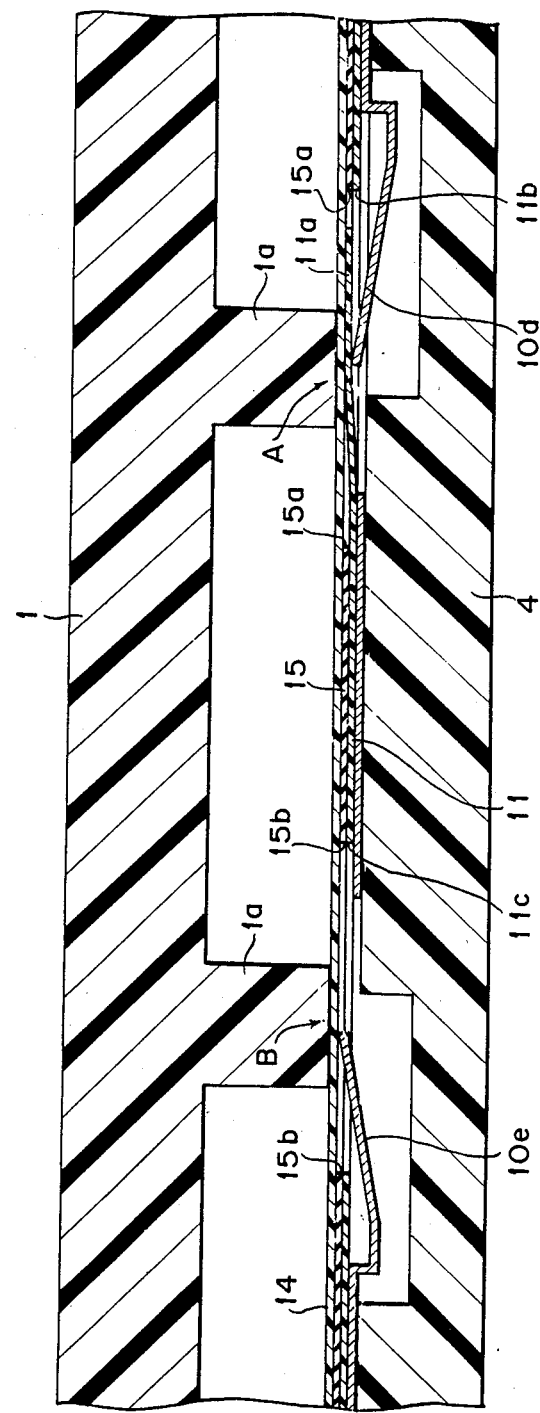
FIG. 4 is a cross-sectional view taken along the line 4—4 in FIG. 1, and showing a connection structure of a still further embodiment of the present invention.
Figure 5:
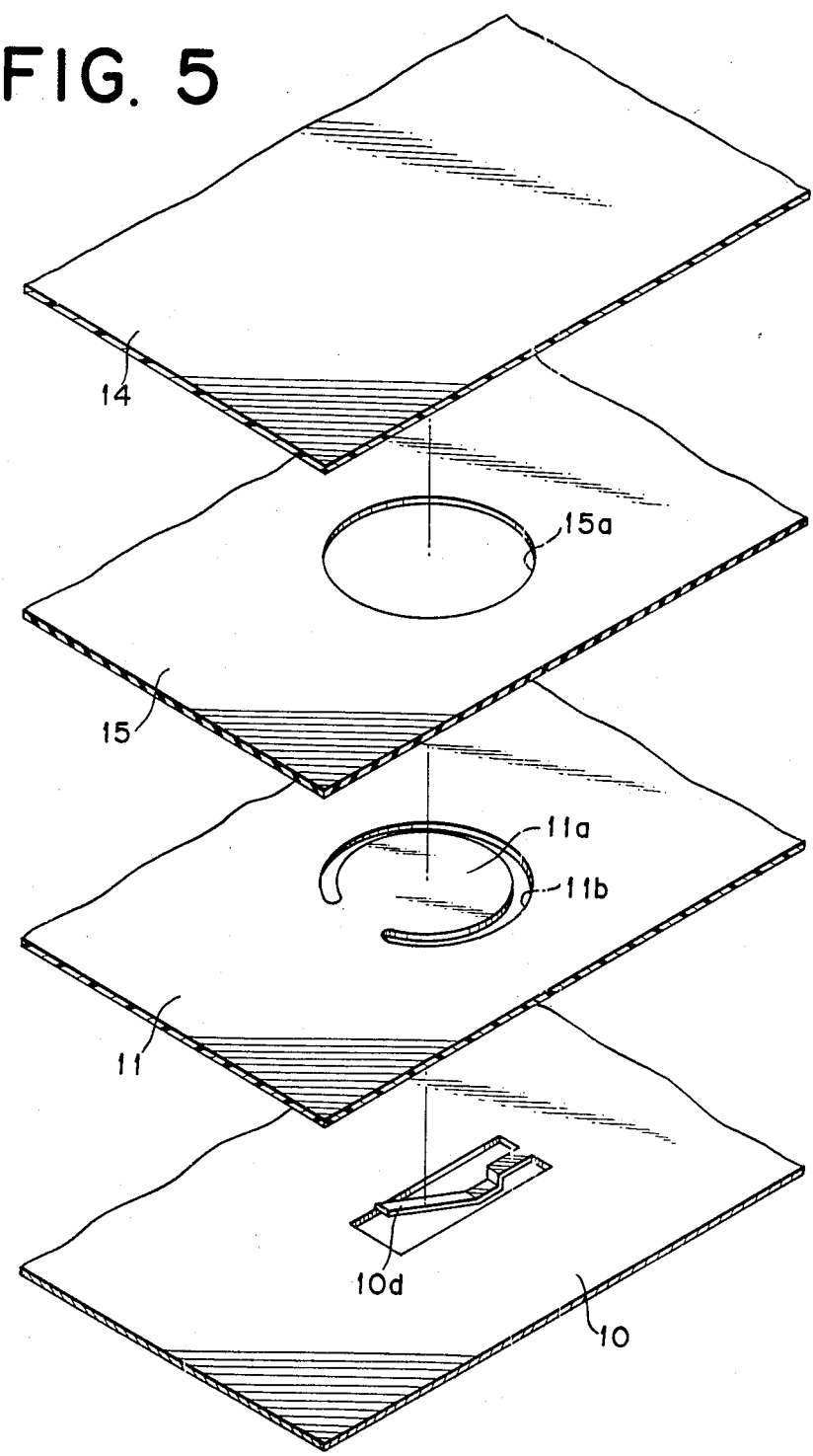
FIG. 5 is a perspective view showing a disassembly of the connection structure in FIG. 4.

FIGS. 4 and 5 show an embodiment of an electrically conductive structure between an upper flexible printed circuit board and a lower flexible printed circuit board in a portion corresponding to a line 4—4 in FIG. 1A.

In FIGS. 4, 5 and 6 reference numeral 14 denotes an upper side flexible printed circuit board having a circuit including a plurality of key contacts corresponding to keys of the keyboard 3 and so on. As shown in FIG. 6, this flexible printed circuit board 14 has a size substantially the same as the keyboard 3.

Reference numeral 11 denotes a lower side flexible printed circuit board which is the same as the flexible printed circuit board denoted by reference numeral 11 in FIGS. 2 and 3. The LSI 5 is mounted on the extended portion of that flexible printed circuit board 11 and the liquid crystal display device 9 is connected to the printed circuit board 11 at its end.

An insulating plate 15 is disposed between the upper and lower printed circuit boards 14 and 11. As shown in FIGS. 5 and 6, through-holes 15a are formed in this insulating plate 15 at positions opposite to key contacts 16 and conductive portions between the upper and lower printed circuit boards 14 and 11.

A tongue member 11a is provided in the lower side printed circuit board 11 at a position corresponding to the position of the through-hole 15a. It is preferable that a slit 11b is formed between this tongue member 11a and a portion of the flexible printed circuit board 11 surrounding this tongue member 11a, so that the tongue member 11a is more flexible than the flexible printed circuit board 11.

As mentioned above, in conventional arrangements, the electrical conduction of these upper and lower printed circuit boards 14 and 11 is made by a pressing force applied by an elastic force of rubber or similar resilient material disposed on the outer side of either the upper or lower printed circuit board at a position corresponding to the desired electrical conduction.

In the present invention, as shown in FIGS. 4, 5 and 6, a tongue member 10d that is a projection having elasticity is formed in a portion of the noise shield plate 10. The elastic force of this tongue member 10d presses the tongue member 11a of the lower printed circuit board 11 against the upper printed circuit board 14 through the through-hole 15a at position A.

Since the slit 11b is formed around the tongue member 11a of the lower printed circuit board 11 which is pushed upward by the tongue member 10d, even a small elastic force presses the lower printed circuit board 11 securely against the upper printed circuit board 14 at position A.

Furthermore, it is preferable that the elastic force of the tongue member 10d is received by a rib 1a protruded from the lower surface of the upper case 1 at a position corresponding to the pressing position. This arrangement prevents the upper printed circuit board 14 from being pushed upward.

As shown in FIG. 4, a through-hole 11c is formed in the lower printed circuit board 11, and a through-hole 15b is formed in the insulating plate 15. These through-holes 11c and 15b are disposed at a position corresponding to the position of the (+) side electrical supply pattern on the upper printed circuit board 14.

A tongue member 10e is formed in the noise shield plate 10 corresponding to the positions of the through-holes 11c and 15b. This tongue member 10e comes in contact with the upper printed circuit board 14 at position B through the through-holes 11c and 15b. Consequently, the (+) electrical power supply line from the (+) battery contact 10c (FIG. 3) is led to the upper printed circuit board 14 at position B through the tongue member 10e.

Accordingly, by disposing the structure according to the present invention in the vicinity of the (+) side input terminal 5a of the LSI 5, the (+) electrical power supply line is led from the (+) battery contact 10c through the noise shield plate 10, the tongue member 10e position B, the upper printed circuit board 14, position A and the lower printed circuit board 11 to the (+) input terminal of the LSI 5.

The need for a jumper wire, therefore, is eliminated. At the same time, the number of parts and the number of assembly steps are reduced greatly, and accordingly the connection structure is provided at a lower cost.

As is clear from the above explanation, according to the present invention, a noise shield plate is utilized as means for electrical connection, and a portion of the noise shield plate is also utilized as a contact or as means for pressing electronic components or devices. Therefore, the connection structure in accordance with the present invention greatly reduces the number of parts required for the structure and the number of assembly steps when assembling the structure, and thus the connection structure is provided at a lower cost.

What is claimed is:

1. A connection structure for electrically and mechanically connecting electronic components contained in a case comprising:

a case having first and second opposed case members;
a first flexible printed circuit board formed of an insulating material and disposed within said case, said first circuit board having a first surface which faces said first case member and a second surface which is provided with an electric circuit including a plurality of contacts;

an insulating sheet positioned so as to face said second surface of said first circuit board, and having at least one first hole and a plurality of second holes disposed at positions facing respective said contacts of said circuit of said first circuit board;

a second flexible printed circuit board formed of insulating material and having first and second opposed surfaces, with said first surface of said second printed circuit board being provided with an electric circuit containing a plurality of contacts disposed opposite respective said holes and being disposed so that it is adjacent and facing said insulating sheet;

a metal plate disposed between said second case member and said second surface of said second printed circuit board and having at least one cut and raised portion which presses a respective contact of said second printed circuit board through said at least one first hole against a respective contact of said first printed circuit board; and, a key-input means disposed adjacent said first surface of said first printed circuit board for selectively pressing respective said contacts of said first printed circuit board against respective said contacts of said second printed circuit board via respective said second holes of said insulating sheet.

2. A connection structure for electrically and mechanically connecting electronic components contained in a case comprising:

a case having first and second opposed case members;

a first flexible printed circuit board formed of an insulating material and disposed within said case, said first circuit board having a first surface which faces said first case member and a second surface which is provided with an electric circuit including a plurality of contacts;

an insulating sheet positioned so as to face said second surface of said first circuit board, and having at least one first hole and a plurality of second holes disposed at positions facing respective said contacts of said circuit of said first circuit board;

a second flexible printed circuit board formed of insulating material and having first and second opposed surfaces with said first surfaces of said second printed circuit board being disposed so that it is adjacent and facing said insulating sheet, and with said first surface of said second printed circuit board being provided with an electric circuit containing a plurality of contacts disposed opposite respective said second holes and at least one hole disposed opposite said at least one hole of said insulating sheet;

a metal plate disposed between said second case member and said second surface of said second printed circuit board and having at least one cut and raised portion which extends through said at least one hole of said second circuit board and said at least one hole of said insulating sheet and contacts a respective said contact of said first printed circuit board; and a key-input means disposed adjacent said first surface of said first printed circuit board for selectively pressing respective said contacts of said first printed circuit board against respective said contacts of said second printed circuit board via respective said second holes of said insulating sheet.

3. A connection structure as defined in claim 2, further comprising a source of electrical power; and wherein said metal plate further includes a connection portion connected to said source in order to supply the electric power of said source to said electric circuit of said first printed circuit board.

4. A connection structure as defined in claim 3, wherein said source of electrical power is a battery disposed in said case.

5. A connection structure for electrically and mechanically connecting electronic components contained in a case comprising:

a case having first and second opposed case members;

a first flexible printed circuit board formed of an insulating material and disposed within said case, said first circuit board having a first surface which faces said first case member and a second surface which is provided with an electric circuit including a plurality of contacts;

an insulating sheet positioned so as to face said second surface of said first circuit board, and having holes disposed at positions facing respective said contacts of said circuit of said first circuit board;

a second flexible printed circuit board formed of insulating material and having first and second opposed surfaces, with said first surface of said second printed circuit board being provided with an electric circuit containing a plurality of contacts, at least some of which are disposed opposite said holes, and being disposed so that it is adjacent and facing said insulating sheet;

a display means disposed in said case adjacent said first case member and having electrode portions for connection to selected said contacts of said electric circuit of said second circuit board; and a metal plate disposed between said second case member and said second surface of said second printed circuit board and extending beneath said display means, said metal plate having raised portions which press respective said contacts of said second printed circuit board through respective said holes of said insulating sheet against respective said contacts of said first printed circuit board, a raised protrusion which supports and raises a portion of said second circuit board containing said selected contacts against said electrode portions of said display means, and an upwardly bulged portion beneath said display means which supports said display means.

6. A connection structure as defined in claim 5 wherein said upwardly bulged portion supports said display means by pressing same against an inner surface portion of said first case member.

7. A connection structure for electrically and mechanically connecting electronic components contained in a case comprising:

a case having first and second opposed case members;

a first flexible printed circuit board formed of an insulating material and disposed within said case, said first circuit board having a first surface which faces said first case member and a second surface which is provided with an electric circuit including a plurality of contacts;

an insulating sheet positioned so as to face said second surface of said first circuit board, and having at least one hole disposed at a position facing a respective one of said contacts of said circuit of said first circuit board;

a second flexible printed circuit board formed of insulating material and having first and second opposed surfaces, with said first surface of said second printed circuit board being provided with an electric circuit containing a plurality of contacts and being disposed so that it is adjacent and facing said insulating sheet, said second circuit board further having at least one hole positioned opposite said hole in said insulating sheet;

a display means disposed in said case adjacent said first case member and having electrode portions for connection to selected said contacts of said electric circuit of said second circuit board; and a metal plate disposed between said second case member and said second surface of said second printed circuit board and extending beneath said display means, said metal plate having a cut and raised portion which extends through said hole in said second circuit board and said hole in said insulating sheet and electrically contacts said one of said contacts of said first printed circuit board, a raised protrusion which supports and raises a portion of said second circuit board containing said selected contacts against said electrode portions of said display means, and an upwardly bulged portion beneath said display means which supports said display means.

8. A connection structure as defined in claim 7, further comprising a source of electrical power; and wherein said metal plate further includes a connection portion connected to said source in order to supply the electric power of said source to said electric circuit of said first printed circuit board.

9. A connection structure for electrically and mechanically connecting electronic components comprising:
an insulating sheet having first and second opposed surfaces and having a plurality of holes;
a first flexible printed circuit board formed of an insulating material having first and second opposed surfaces with said first surface being disposed adjacent and facing said first surface of said insulating sheet and being provided with an electric circuit including a plurality of contacts disposed at positions facing respective said holes in said insulating sheet;
a second flexible printed circuit board formed of insulating material and having first and second opposed surfaces, with said first surface of said second printed circuit board being provided with an electric circuit containing a plurality of contacts disposed opposite said holes and being disposed so that it is adjacent and facing said second surface of said insulating sheet;
pressing means including a first pressing portion for pressing respective said contacts of said first printed circuit board against corresponding said contacts of said second printed circuit board via respective said holes formed in said insulating sheet, and a second pressing portion for pressing respective said contacts of said second printed circuit board against corresponding said contacts of the first printed circuit board via respective said holes in said insulating sheet.

10. A connection structure as defined in claim 9, wherein said first pressing portion of said pressing means, comprises a key-input means disposed adjacent to said second surface of said first printed circuit board.

11. A connection structure as defined in claim 10, further comprising pressing plate means, disposed adjacent to said second surface of said second printed circuit board for supporting pressing force exerted by said key-input means.

12. A connection structure as defined in claim 9, wherein said second pressing portion of said pressing means, comprises a pressing plate which is provided with a cut-and-raised portion and which is disposed adjacent said second surface of said second printed circuit board.

13. A connection structure as defined in claim 12, further comprising a case for said insulating sheet, said first and second printed circuit boards and said pressing means; and wherein said case includes means disposed adjacent to said second surface of said first printed circuit board for supporting pressing force applied by said cut-and-raised portion of said pressing plate.

* * * * *